United States Patent
Koffler et al.

(10) Patent No.: US 9,595,821 B2
(45) Date of Patent: Mar. 14, 2017

(54) FAILURE DETECTION FOR SWITCH DEVICES

(71) Applicant: Infineon Technologies Austria AG, Villach (AT)

(72) Inventors: Harald Christian Koffler, Villach (AT); Friedrich Kroener, Villach (AT)

(73) Assignee: Infineon Technologies Austria AG, Villach (AT)

( * ) Notice: Subject to any disclaimer, the term of this patent is extended or adjusted under 35 U.S.C. 154(b) by 175 days.

(21) Appl. No.: 14/491,710

(22) Filed: Sep. 19, 2014

(65) Prior Publication Data

US 2016/0087418 A1    Mar. 24, 2016

(51) Int. Cl.
| | | |
|---|---|---|
| *H03H 3/08* | (2006.01) | |
| *H02H 3/08* | (2006.01) | |
| *H03K 17/082* | (2006.01) | |
| *H03K 17/12* | (2006.01) | |

(52) U.S. Cl.
CPC ........... *H02H 3/08* (2013.01); *H03K 17/0822* (2013.01); *H03K 17/122* (2013.01); *H03K 2217/0027* (2013.01)

(58) Field of Classification Search
CPC ..... H02H 3/08; H03K 17/0822; H03K 17/122

USPC ....................................................... 361/91.1
See application file for complete search history.

(56) References Cited

U.S. PATENT DOCUMENTS

| | | | |
|---|---|---|---|
| 6,005,354 A | 12/1999 | Houk | |
| 7,265,566 B2 | 9/2007 | Graf | |
| 2006/0098368 A1* | 5/2006 | Gentillet | G06F 1/206 361/93.1 |
| 2009/0116158 A1* | 5/2009 | Graves | H02H 3/20 361/86 |
| 2012/0236456 A1* | 9/2012 | Yu | H03K 17/0822 361/91.1 |
| 2012/0287545 A1* | 11/2012 | Tran | H02M 1/38 361/101 |

FOREIGN PATENT DOCUMENTS

| | | |
|---|---|---|
| DE | 19736894 C2 | 5/2002 |
| DE | 10143487 C2 | 7/2003 |
| DE | 10255602 A1 | 6/2004 |
| DE | 10354443 B4 | 7/2008 |
| DE | 102009051056 B4 | 4/2012 |

* cited by examiner

Primary Examiner — Dharti Patel
(74) Attorney, Agent, or Firm — Slater Matsil, LLP (57) ABSTRACT

A device and a method for temporarily closing a switch are disclosed. In an embodiment the device includes a first switch configured to be coupled to a load and a control circuit configured to temporarily close the first switch in response to a detection of a failure event in the first switch.

19 Claims, 10 Drawing Sheets

FAILURE DETECTION FOR SWITCH DEVICES

TECHNICAL FIELD

The present application relates to failure detection for switch devices and to techniques for handling detected failures or potential failures.

BACKGROUND

Switch devices may be used to switch voltages or currents in electronic circuits. In many applications, switch devices are implemented using transistors like field effect transistors (FETs), bipolar transistors or mixtures thereof like insulated gate bipolar transistors (IGBTs). Such switches in some applications may for example be used to selectively couple a load to a supply voltage. In some applications, high supply voltages, e.g. of the order of some 100 V, may be required.

Therefore, when the switch is in an open state (i.e. a state where the switch is essentially non-conducting between load terminals), a comparatively high voltage drop may be present at the switch. In some cases, for example radiation like cosmic radiation in such a situation may cause a generation of carriers, which are accelerated by an electric field corresponding to the voltage drop, which may in turn lead to an avalanche breakdown of the switch. In particular, a small area of the switch, also referred to as a filament, may become conducting by the generation of carriers. Current conduction through such a filament, which may have a comparatively small diameter, may lead to irreversible damages to the switch, for example due to overheating. Such irreversible damages in some instances may occur already after about 50-100 ns.

DETAILED DESCRIPTION OF ILLUSTRATIVE EMBODIMENTS

In the following, various embodiments will be described in detail referring to the attached drawings. These embodiments are given by way of example only and are not to be construed as limiting the scope of the present application.

For example, while embodiments may be described as comprising a plurality of features or elements, in other embodiments, some of these features or elements may be omitted, and/or be replaced by alternative features or elements. In yet other embodiments, additionally or alternatively, further features or elements apart from the ones explicitly described may be provided.

Features or elements from different embodiments may be combined with each other, unless specifically noted otherwise.

In the following embodiments, connections or couplings between elements, blocks or devices may be direct connections or couplings, i.e., connections or couplings without intervening elements or indirect connections or couplings, i.e., connections or couplings with one or more intervening elements, unless specifically noted otherwise, as long as the general function of the connection or coupling, for example to transmit a certain kind of signal or information, is basically maintained. Connections or couplings may be wire-based connections or couplings or wireless connections or couplings.

Some of the following embodiments use switches. Switches may be described as having two load terminals and a control terminal. A state of the switch may, for example, be open or closed, and the state may be controlled by a signal applied to the control terminal. In a closed state (sometimes also referred to as on-state), the switch may be conducting between its load terminals, i.e., have a low ohmic resistance between its load terminals, and in an open state (sometimes also referred to as off-state) the switch may be non-conducting, i.e., have a high ohmic resistance between its load terminals. It should be noted that in the open state, in some implementations, still very small currents may flow, for example unintended leakage currents.

In some embodiments, switches may be implemented using transistors, for example bipolar transistors, field-effect transistors (FETs) like MOSFETs or insulated gate bipolar transistors (IGBTs) which in some respect are a mixture of bipolar and field-effect transistors. In this case, for example, a gate terminal or a base terminal may correspond to a control terminal of the switch, and source and drain terminals or emitter and collector terminals may correspond to load terminals.

In some embodiments, upon detection of a failure event in an open switch, the switch may be temporarily closed, for example to prevent permanent damage to the switch. In some embodiments, the failure event may be an event indicative of an avalanche breakdown of the switch.

In other embodiments, a switch device may comprise a first switch and a second switch. The first switch and a second switch may be coupled in parallel. A first inductivity may be coupled in series with the first switch, and a second inductivity may be coupled in series with the second switch. A failure event may be detected by monitoring voltages at the first inductivity and/or at the second inductivity. In other embodiments, other techniques may be used.

Figure 1:
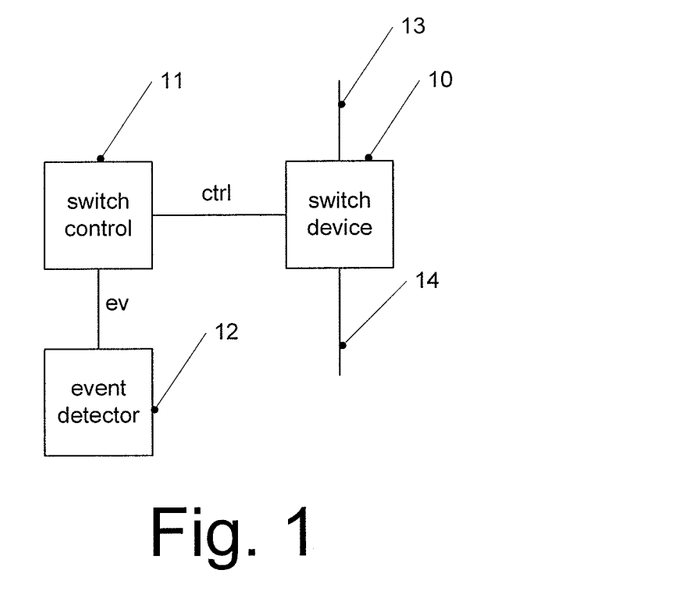
FIG. 1 is a block diagram of a device according to an embodiment.

Turning now to the Figures, in FIG. 1 a block diagram illustrating a device according to an embodiment is shown. The device of FIG. 1 comprises a switch device 10. Switch device 10 may comprise one or more switches to selectively open and close a connection between load terminals 13, 14 of switch device 10. In some embodiments, switch device 10 may comprise transistors as the one or more switches. In some embodiments, switch device 10 may be operable to switch a supply voltage, for example a supply voltage involving voltages of the order of some 100 V, although applications of the device of FIG. 1 are not limited so such voltages. In some embodiments, switch device 10 may be operable as a high side switch to selectively couple a load to a positive supply voltage or as a low side switch to selectively couple a load to a negative supply voltage or ground. However, switch device 10 is not limited to such applications.

Switch device 10 of FIG. 1 furthermore comprises an event detection circuit 12 which is adapted to detect failure events in switch device 10. For example, event detector 12 may be adapted to detect when an avalanche breakdown, caused for example by cosmic radiation, is imminent, has started or is otherwise happening or about to happen. The detection of a failure event is indicated in a signal ev. A switch control 11 receives signal ev and controls switch device 10 via a control signal ctrl fed to a control input of switch device 10.

In response to event detector 12 detecting a failure event, switch control 11 may control switch device 10 to be temporarily closed in the embodiment of FIG. 1. For example switch device 10 may be closed for a time duration between about 10 ns and about 100 ns, but is not limited thereto. In some embodiments, by temporarily closing the switch an electrical field causing the avalanche breakdown, for example an electrical field caused by a voltage drop in an open state of switch device 10, may be reduced or removed. In some embodiments, this may terminate an avalanche multiplication. In embodiments, the temporary closing of switch device 10 may be tolerated by an apparatus including switch device 10. In some embodiments, in normal operation, e.g. when no failure event is indicated, switch control 11 may control switch device 10 to selectively couple a load with a voltage. Implementation examples of the various devices, blocks and techniques described with reference to FIG. 1 will be explained later in more detail.

Figure 2:
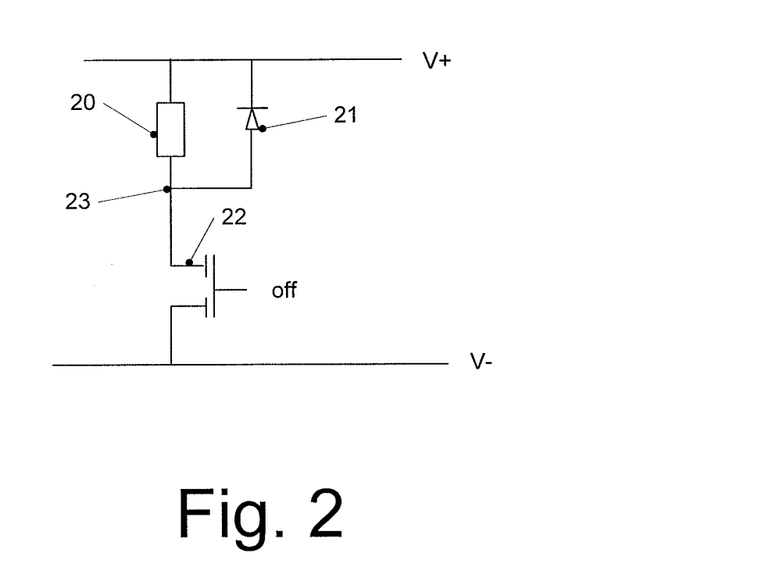
FIG. 2 is a circuit diagram illustrating some features of some embodiments.

Next, as an illustrative example the behavior of a transistor in a failure event caused for example by cosmic radiation will be explained. In FIG. 2, a transistor 22 acting as a switch is illustrated. Transistor 22 in the example shown is configured as a low side switch to selectively couple a load, which is represented by a circuit element 20 and a diode 21, with a negative supply voltage V−. Element 20 may be a combination of resistive components with reactive components of capacitive and or inductive type. Elements 20, 21 are furthermore coupled to a positive supply voltage V+. In other embodiments, a transistor may be used as a high side switch.

Figure 3:
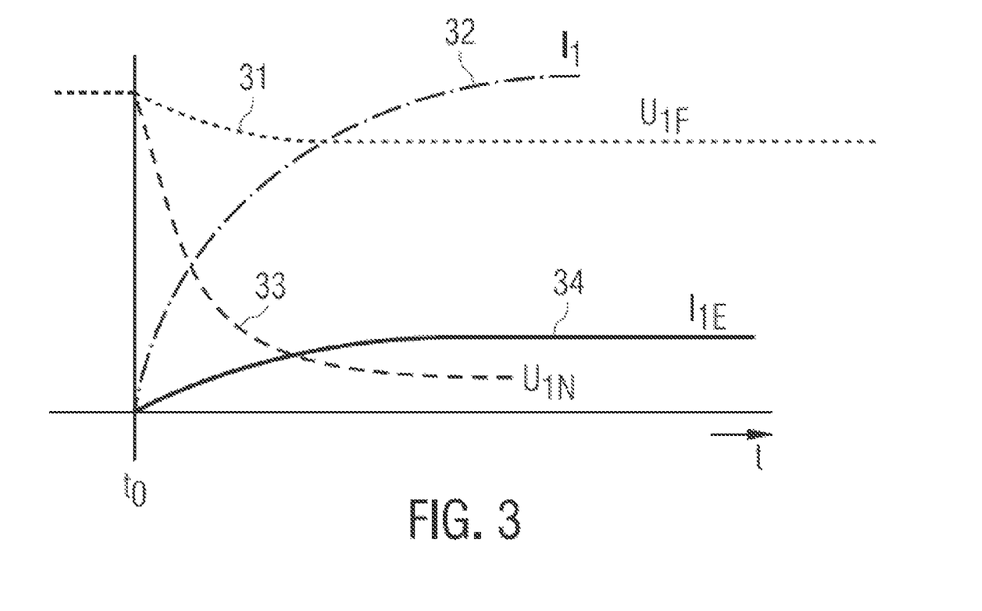
FIGS. 3 and 4 are diagrams illustrating the behavior of the circuit of FIG. 2 under some circumstances.

In an example, transistor 22 is turned off, i.e. switched to an open state, thus disconnecting load 20, 21 from negative supply voltage V−. FIG. 3 shows curves for voltages and current through a node 23 in FIG. 2 for two cases. Curve 33 illustrates a voltage at node 23 when transistor 22 is closed at a time $t_0$, and a curve 32 illustrates a current $I_1$ through node 23 when transistor 22 is closed at time $t_0$. A curve 31 illustrates the voltage at node 23 in case of an avalanche event caused for example by cosmic radiation, and a curve 34 illustrates a corresponding current through node 23. It should be noted that FIG. 3 only shows the transient behavior immediately after switching on switch transistor 22 at $t_0$. The behavior for longer times may differ. For example, when switching on a load like a light bulb, the resistance of the light bulb increases with time, which would lead to a decreasing value of $I_1$.

In such an avalanche event, carriers (for example electron-hole pairs) are generated by an event like a particle of cosmic radiation or the like. The carriers are then accelerated by an electric field caused by the voltage drop (difference between V+ and V−), generating further electron hole pairs, i.e. further carriers. This may lead to a formation of a conductive path in the switch (which is in an off-state), the conductive path being also referred to as filament in the context of this application.

FIG. 3 illustrates that for the failure event discussed (avalanche breakdown), the voltage at node 23 decreases only slightly, and a comparatively small current flows. However, for both cases (closing the switch and avalanche breakdown) the power dissipated by the switch, which is a product of current and voltage, may be approximately the same. However, in the avalanche case the filament formed may for example have a diameter of only a few micrometers, which may lead to a strong local heating of transistor 22. This strong heating may in turn lead to an irreversible damage. For example, in events as discussed above the conductive filament may be formed within a few nanoseconds or less, and a permanent damage to a transistor may occur after about 20 ns to 50 ns. It should be noted that these numerical values and the curves shown in FIG. 3 serve merely as illustrative examples, and in other implementations or other types of events other curves and/or other numerical values may apply.

Figure 4:
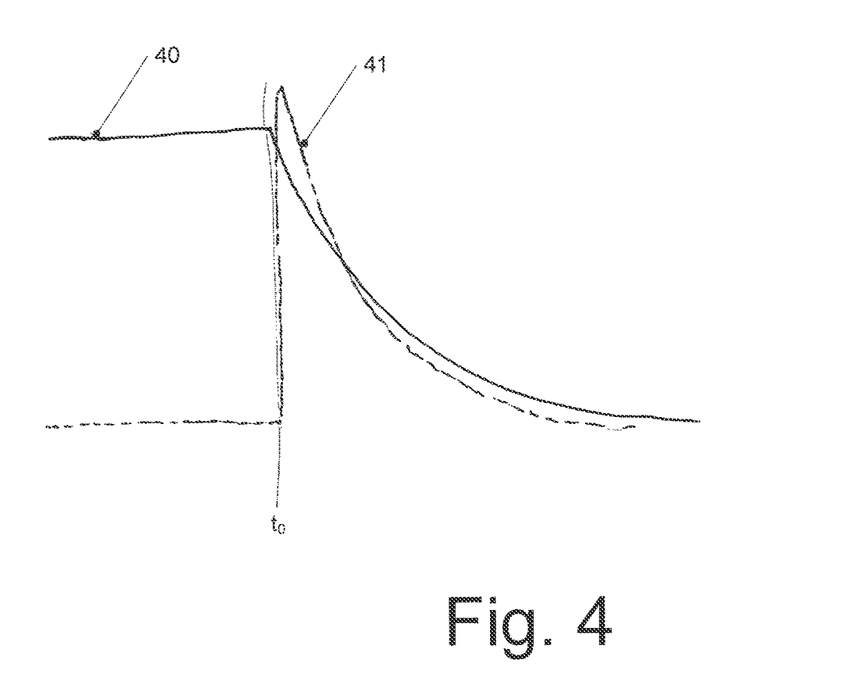

In FIG. 4, an example behavior of voltage and current is illustrated in case a load is a capacitive load. Again, for illustrative purposes it is assumed that transistor 22 is off and then is switched on at a time $t_0$. A curve 40 shows the behavior of the voltage at node 23 (assuming that element 20 for example is a capacitive load), and curve 41 shows an example current. Here, when switching on, while the first moments are critical then voltage and current drop rapidly too, thus reducing power dissipation. On the other hand, for a failure event as described above the behavior would be similar as shown in FIG. 3, and similar problems could occur.

To further illustrate by way of example, a filament formed in an avalanche event as described above may have a diameter of about 10 μm² and a length of about 100 μm in some transistor implementations. In a failure event, the filament may for example be warmed adiabatically to 500° C., which may for example adversely affect an aluminum metallization used in a switch device like transistor 22. In typical silicon implementations, this may correspond to a dissipated energy of 1 μJ. For a damaging within ten nanoseconds this would correspond to an integrated power of 100 W during this short time. Assuming a reverse voltage in an off-state of about 1000 V, which as illustrated in FIG. 3 is not significantly reduced during the event, this corresponds to a current of 0.1 A. This in turn would correspond to a resistance of the filament of about 10 kΩ. This resistance therefore in the example given is significantly higher than a typical on-resistance of a transistor used as a switch in typical applications. It is to be emphasized again that the above numerical values and calculations serve only as illustrative examples to improve understanding of the operation of some embodiments and are not to be construed as limiting, as for other implementations or events other values may apply.

Returning to FIG. 1, when in such an example implementation of a switch a corresponding avalanche event is detected and switch control 11 temporarily turns switch device 10 (for example a transistor like transistor 22) on, the current is distributed evenly over the complete area of the transistor. Additionally, the voltage between the load terminals of the transistor (for example source and drain in the example of FIG. 2) then decreases rapidly, which in some embodiments stops the avalanche multiplication in the filament. Therefore, in embodiments by the temporary closing of the switch device, an avalanche multiplication may be stopped in some embodiments, which in some embodiments may prevent damaging of the switch device or at least reduce a chance of damaging the switch device.

Figure 5:
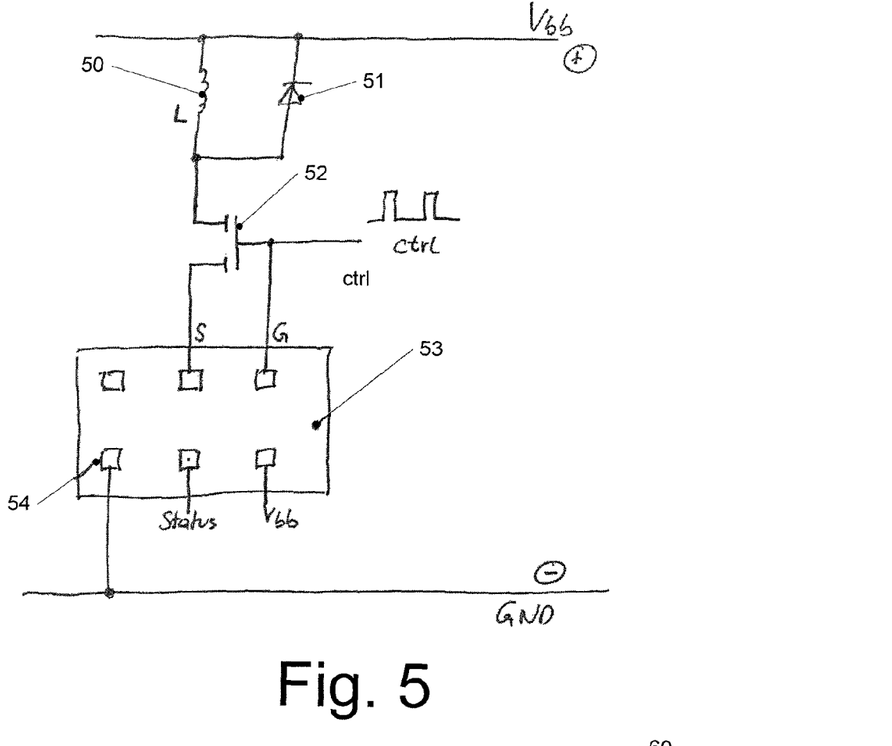
FIG. 5 is a circuit diagram illustrating a device according to an embodiment.

In FIG. 5, a circuit diagram illustrating a device according to a further embodiment is illustrated. The embodiment of FIG. 5 comprises a low side switch 52 to selectively couple a load comprising an inductivity 50 and a diode 51 with a negative supply voltage, in the example of FIG. 5 ground. Furthermore, load 50, 51 is coupled to a positive supply voltage $V_{bb}$, for example a battery voltage.

In normal operation, switch 52 may be controlled by a control signal ctrl. In some embodiments, control signal ctrl may control transistor 52 according to a pulse width modulation scheme.

Furthermore, in the embodiment of FIG. 5 transistor 52, which is an example for a switch, is coupled to ground via a monitoring circuit 53. Monitoring circuit 53 in the example shown has a terminal S coupled to a source terminal, i.e. to one of the load terminals, of transistor 52. Furthermore, circuit 53 comprises a terminal G coupled to the gate terminal of transistor 52. Circuit 53 furthermore comprises a status terminal which may be used to indicate if the transistor 52 is open or closed. In some embodiments, circuit 53 may be adapted to perform monitoring and emergency functions described in the following only when a status signal at the status terminal indicates that transistor 52 is open. In some embodiments, the status signal may correspond to control signal ctrl or be derived therefrom.

Furthermore, circuit 53 comprises supply terminals for battery voltage $V_{bb}$ and ground, respectively, to provide a supply voltage. Circuit 53 additionally is coupled with ground at a terminal 54. For example, circuit 53 may comprise a current path from terminal 54 to terminal S, thus coupling transistor 52 with ground. On this current path, in some embodiments measurements may be performed to detect an event as described above, for example an avalanche effect resulting in the formation of a conductive filament.

Figure 6A:
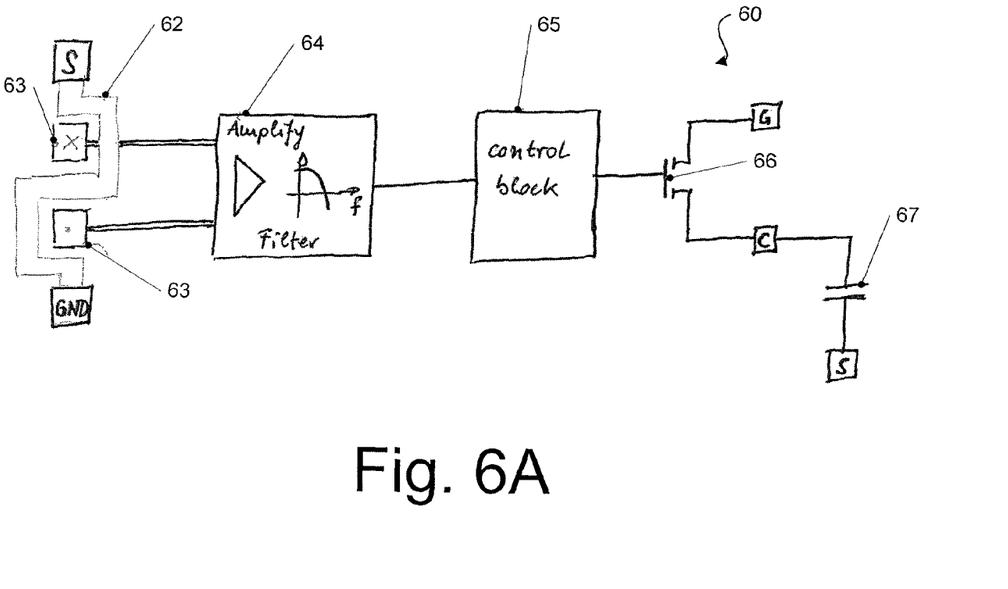
FIGS. 6A-6C are a diagrams illustrating devices according to some embodiments.

FIG. 6A illustrates a circuit 60 which may e.g. be an implementation example of circuit 53 of FIG. 5. Circuit 60 of FIG. 6A comprises a current path 62, which may for example couple terminal 54 and terminal S illustrated in FIG. 5.

Current path 62 may be magnetically coupled to one or more magnetic sensor(s) 63. Magnetic sensor(s) 63 may be single or multiple Hall-Sensors, arrangements of differential Hall-Sensors, GMR (giant magneto-resistive) Sensors or other types of magnetic sensors. The output of magnetic sensors is fed into a signal conditioning circuitry 64 to amplify and filter the sensor signal. Via magnetic sensors 63 and signal conditioning circuitry 64 a current slope dI/dt of a current in current path 62 may be sensed and fed into a control circuit or block 65.

Figure 6B:
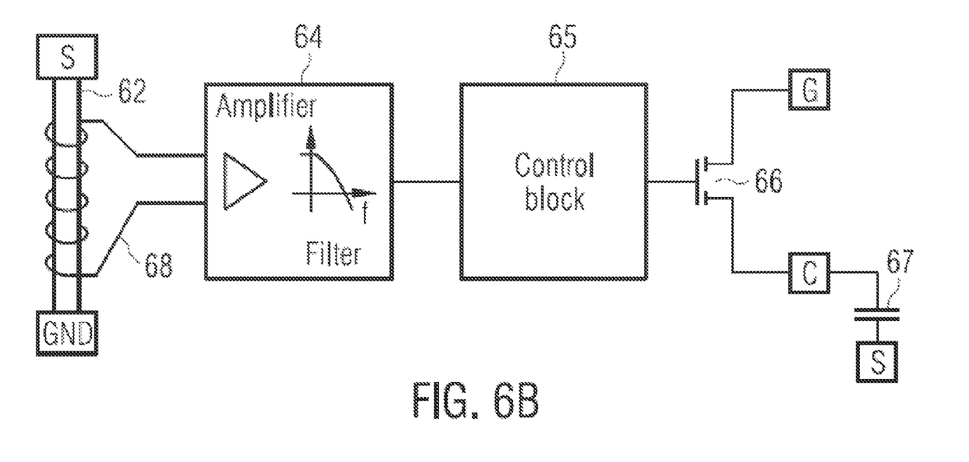

FIG. 6B shows an alternative approach to the approach of FIG. 6A. In the embodiment of FIG. 6B, instead of magnetic sensors 63 a coil 68 which is wound around current path 62 is provided. A first terminal and a second terminal of coil 68 are coupled to signal conditioning circuitry 64. Via coil 68 and signal conditioning circuitry 64 a current slope dI/dt of a current in current path 62 may be sensed, amplified, filtered and fed into control circuit or block 65.

Figure 6C:
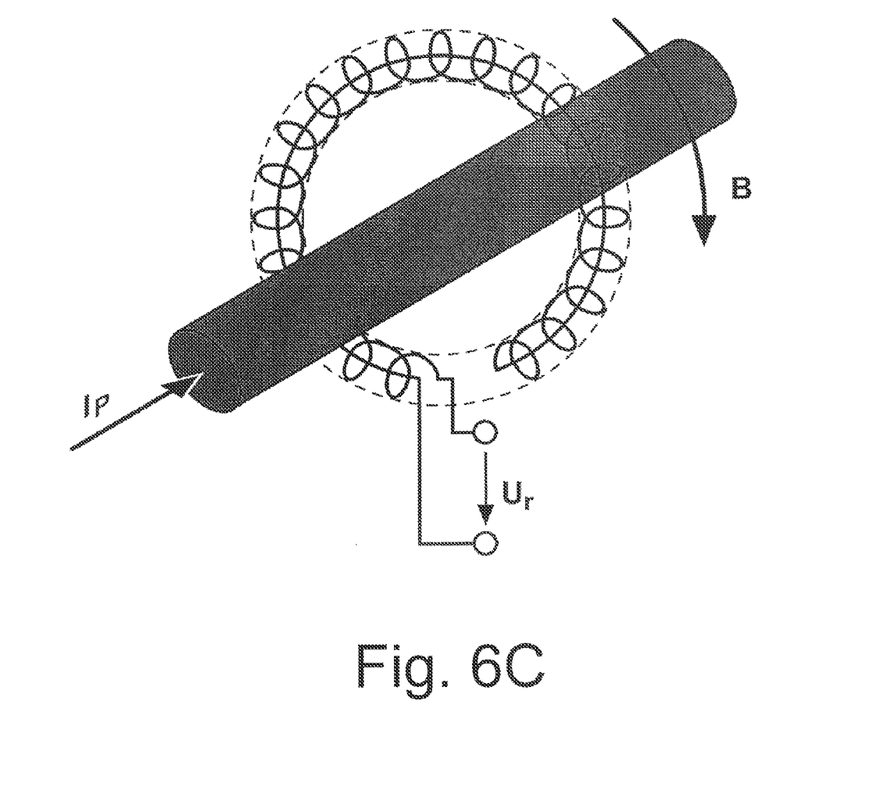

In FIG. 6C an alternative implementation of coil 68 in the form of a so-called Rogowski coil is illustrated. Other conventional current measuring techniques may also be used.

When a switch like transistor 52 is open (as may be indicated for example by the status signal in FIG. 5), an increase of current as sensed by magnetic sensor(s) 63 or coil 68 may indicate the onset of an avalanche event as described above. In this case, control circuit or block 65 closes a switch 66, which may be implemented by a transistor. In the example of FIGS. 6A and 6B, charge stored in a capacitor 67, the other terminal of which capacitor is attached to the source terminal S, is fed to the gate terminal G, which temporarily closes the switch, for example transistor 52 of FIG. 5. In embodiments, as described above this may distribute the current over a wider area and reduce a voltage drop, thus terminating the avalanche effect. In embodiments, the device may be adapted to tolerate the temporary closing of the switch.

Further techniques for sensing an avalanche event will be described later with respect to FIGS. 8-15.

It should be noted that in embodiments, besides or alternatively to temporarily closing a switch, further measures may be taken, for example, shutdown of a complete device, reporting an error to a control instance like a microcontroller or the like.

Figure 7:
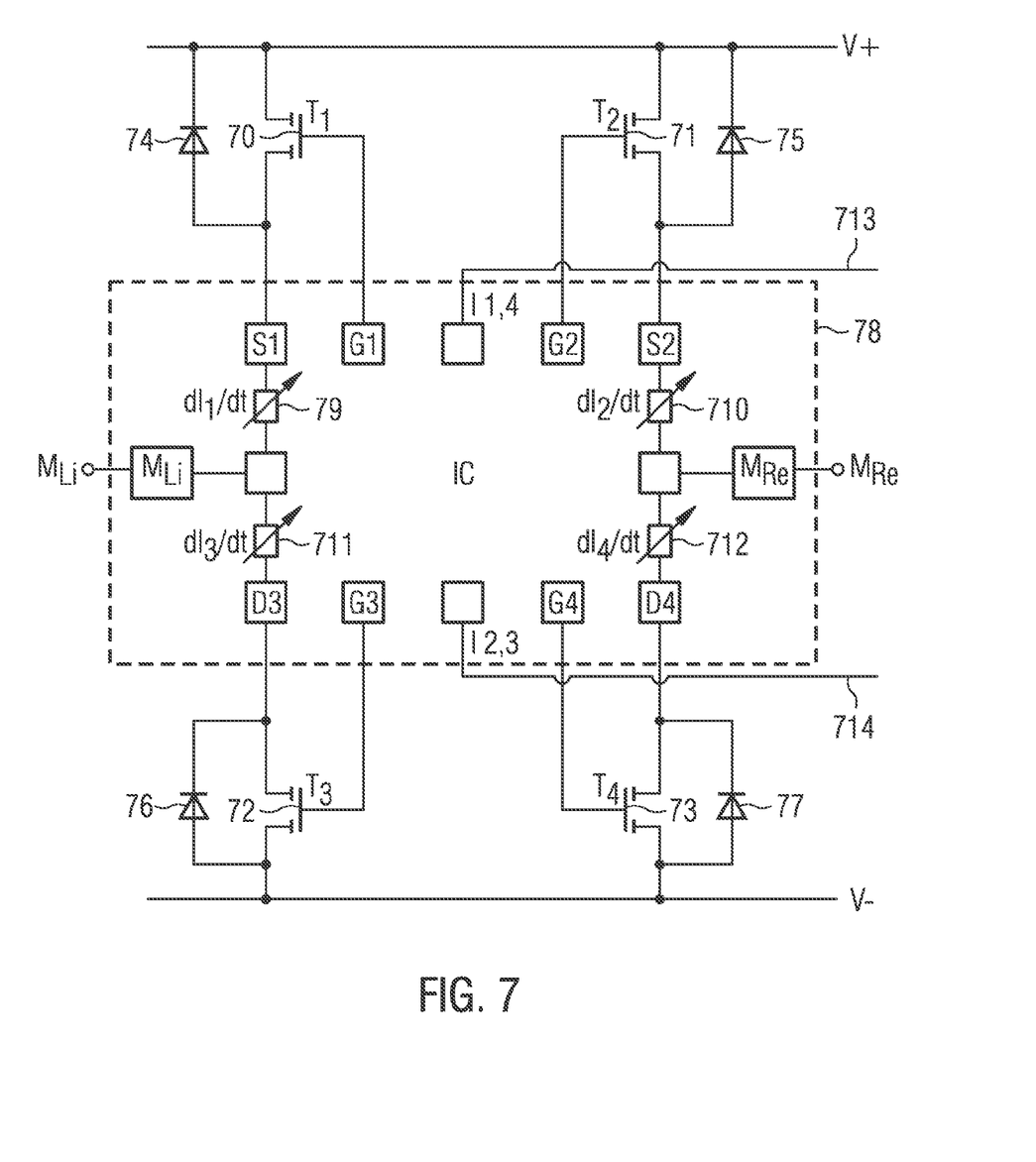
FIG. 7 is a circuit diagram illustrating a further embodiment.

In FIG. 7, a circuit according to a further embodiment is schematically illustrated. In the embodiment of FIG. 7, techniques and concepts as illustrated above are applied to a full bridge circuit, which may for example be used to supply current to a motor coil of an electric motor. The embodiment of FIG. 7 comprises a first transistor 70, a second transistor 71, a third transistor 72 and a fourth transistor 73, also labeled $T_1$-$T_4$ in FIG. 7. Recovery diodes 74-77, respectively, are illustrated as being coupled between respective load terminals of transistors 70-73, respectively. Recovery diodes 74-77 may be parasitic diodes or diodes explicitly provided in addition to transistors 70-73. In other embodiments, other switches may be used.

In operation, transistors 70 and 73 are closed, and transistors 72 and 71 are open, leading to a current flow from terminal $M_{li}$ through the motor coil to terminal $M_{re}$, or vice versa, leading to a current flow in the opposite direction.

Furthermore, the embodiment of FIG. 7 comprises a circuit 78. Terminals of circuit 78 coupled with source terminals of transistors 70-73 are labeled S, and terminals of circuit 78 coupled with gate terminals of transistors 70-73 are labeled G in FIG. 7. Terminals to be coupled with drain terminals of transistors 70-73 are labeled D. The number behind S, G or D indicates the number of the respective transistor $T_1$-$T_4$ the terminal is connected to.

$M_{li}$ indicates a first terminal of a motor winding of an electric motor, and $M_{re}$ indicates a second terminal. 713, 714 indicate lines for receiving external signals I1,4 and I2,3, respectively, for pulse width modulation, i.e. a current path for synthesizing a sinusoidal current for operating the motor. By switching transistors 70-73 between open and closed states, current may be supplied to a motor as desired, wherein the switching e.g. may be controlled by signals supplied via lines 713, 714 in some embodiments.

For each of transistors 70-73, a respective sensing element 79-712 is configured to sense a current increase through the respective transistor 70-73. When a current increase is sensed while the respective transistor is open, this may indicate an avalanche event, and in response the respective transistor may be temporarily closed. For example, for each of transistors 70-73, circuit 78 may comprise elements as illustrated with respect to FIGS. 6A-6C.

To give an example situation, when current is flowing from terminal $M_{li}$ to terminal $M_{re}$ (from left to right in FIG. 7), a voltage drop between the terminals may be ULR=Vbb−2VTr. Vbb may be a battery voltage corresponding to the positive voltage V+ in FIG. 7, and VTr is a voltage drop over the respective closed transistors 70-73. For example, in the situation described transistors 70, 73 may be closed, while transistors 72, 71 may be open. In case of an event due to cosmic radiation or similar which could cause an avalanche breakdown in one of the open transistors (for example 71 or 72), circuit 78 in this case may temporarily close both transistor 71 and 72 and temporarily open transistors 70, 73, i.e. exchange a currently conducting path via transistors 70, 73 with a currently non-conducting path via transistors 71, 72.

Again, similar to FIG. 6A or 6B capacitors like capacitors 67 may be used in some embodiments within circuit 78 to provide a rapid switching. The switching time to change between the paths shall be represented by trr for purpose of illustration in this example. Trr needs not necessarily be, but may be identical or approximately identical with a reverse recovery time of one of the transistors 70-73.

Therefore, dI/dt in such an example scenario may be equal to −I12/trr, which corresponds to a voltage drop across the motor windings of ULR=−LM×I12/trr, LM indicating the effective inductivity of the motor windings. For example, in an embodiment a current of 1 A during a trr of about 10 ns may correspond to a voltage drop of 100V across an effective inductivity of the motor as small as LM=101.

Therefore, in some embodiments even a comparatively small motor inductivity, e.g., of the order of 1 μH, may induce a voltage sufficiently large to substantially support the desired effect of extinguishing the avalanche breakdown.

Upon switching off transistors 70 and 73, the effective inductivity LM of the motor in embodiments may help to extinguish an electric field in transistors 71 and 72. Transistors 71, 72 may be switched on in this situation by pushing the potential of terminals Mli and Mre into a desired direction in a similar way as done during a normal PWM switching of the motor.

While a low side switch and a bridge circuit for operating a motor have been given as illustrative examples above, temporarily closing a switch responsive to an error event, for example an avalanche breakdown, may also be employed in other situations where switches are used.

In the example above, a monitoring of dI/dt using for example a coil around a conductive path has been used to detect an avalanche breakdown effect. In other embodiments, other techniques may be used. Some further possibilities for detecting such an avalanche event or other disturbance of an open switch device will be discussed next with reference to FIGS. 8-15. The embodiments illustrated in FIGS. 8-15 may be used in conjunction with the embodiments of FIGS. 1-7, but may also be used independently therefrom. For example, in some embodiments other measures than temporarily closing a switch may be taken upon detection of a failure event.

Figure 8:
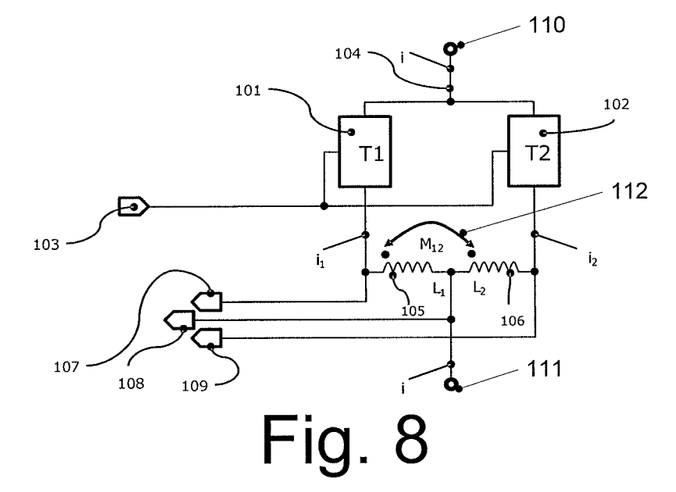
FIG. 8 is a schematic circuit diagram illustrating a device according to an embodiment.

In FIG. 8, a switch device according to an embodiment is schematically illustrated. The switch device of FIG. 8 comprises a first load terminal 110, a second load terminal 111 and a control terminal 103. When the switch device is closed, a current i may flow for example from first control terminal 110 to second control terminal 111 or vice versa. The switch device of the embodiment of FIG. 8 comprises a first switch 101 and a second switch 102. First switch 101 and second switch 102 may be for example transistors like insulated gate bipolar transistors (IGBTs) or field effect transistors (FETs) like MOSFETs, but are not limited thereto. The transistors may be power transistors capable of switching high voltages and/or high currents. In some embodiments, first switch 101 and second switch 102 may be nominally equivalent switches, i.e. they may have the same design parameters. For example, in case of field effect transistors parameters like gate width or gate length may be the same. In other embodiments, different designs may be used.

In some embodiments, first switch 101 and second switch 102 may be integrated in a single integrated device. In other embodiments, for example, separate integrated circuit chips may be used. A control terminal of first switch 101 and a control terminal of second switch 102 are coupled with control terminal 103. Therefore, in the embodiment of FIG. 8 first switch 101 and second switch 102 may be controlled simultaneously, i.e., are both open or both closed depending on a signal applied to control terminal 103.

A first load terminal of first switch 101 and a first load terminal of second switch 102 are coupled with first load terminal 110. A second load terminal of first switch 101 is coupled with a first terminal of a first inductivity 105. A second load terminal of second switch 102 is coupled with a first terminal of a second inductivity 106. A second terminal of first inductivity 105 and a second terminal of second inductivity 106 are coupled with a second load terminal 111. Therefore, when for example in normal operation first switch 101 and second switch 102 are controlled to be closed, a current $i_1$ flows via first switch 101 and first inductivity 105, and a second current $i_2$ flows via second switch 102 and second inductivity 106. The overall current i may be the sum of $i_1+i_2$. In some embodiments, first inductivity 105 may be designed corresponding to second inductivity 106. In such embodiments, $i_1$ may at least approximately be equal to $i_2$ when first and second switches 101, 102 are closed.

As indicated by an arrow 112, in the embodiment of FIG. 8 first inductivity 105 and second inductivity 106 may be implemented as parts of a so-called common mode choke and oriented such that in normal switching operation of first switch 101 and second switch 102 an effect of first inductivity 105 and second inductivity 106 is essentially negligible. In particular, the two inductivities 105, 106 which may correspond to two windings of a common mode choke may be implemented and orientated such that in normal operation voltages induced cancel each other out, when both inductivities 105, 106 are subjected to currents $i_1$, $i_2$, which currents are equal in case each switch 101, 102 shares 50% of the overall current i in normal operation.

An additional effect of the two inductivities 105, 106 in some embodiments is that they may help balancing the share of load current between switches 101 and 102 in normal operation.

In such embodiments, a voltage drop over inductivities 105, 106 in normal operation may be negligible. A common mode choke may have a symmetric configuration, with an inductivity value $L_1$ of first inductivity 101 being equal to an inductivity value $L_2$ of second inductivity 102. The magnetic couplings $M_{12}$ between the inductivities may be the same (e.g., $M_{12}=M_{21}$) and equal to $L_1$, $L_2$.

In case first and second switches 101, 102 are integrated in a single device, for example the first load terminals of first and second switches 101, 102 may be connected with each other inside a housing in order to reduce a number of external pins.

As will be explained later in the following in more detail, when in an open state of the switch device of FIG. 8 one of switches 101, 102 experiences a failure event, for example an avalanche event induced by cosmic radiation or the like, this may be detected by monitoring voltages across first inductivity 105 and second inductivity 106. To enable such a monitoring, terminals 107-109 may serve to tap these voltages.

Before describing the operation and detection of failure events using the switch device of FIG. 8 in more detail, some variations of the switch device of FIG. 8 will be discussed.

Figure 9:
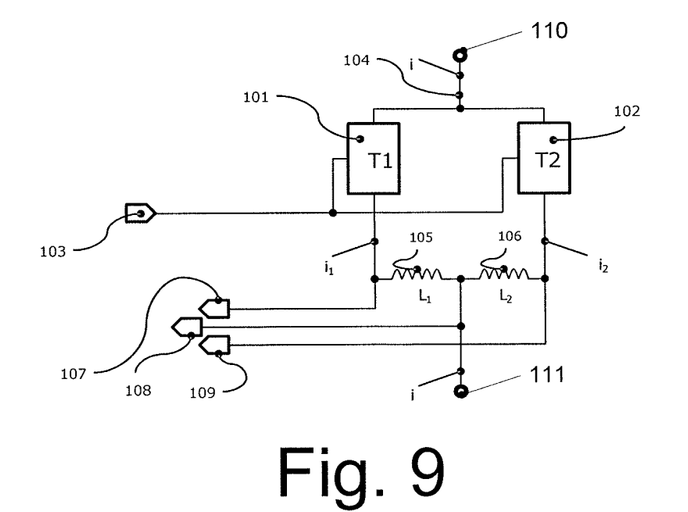
FIG. 9 is a schematic circuit diagram illustrating a device according to an embodiment.

In FIG. 9, an embodiment is shown which corresponds to the embodiment of FIG. 8 with the exception that the magnetic coupling indicated by arrow 112 between first inductivity 105 and second inductivity 106 has been omitted. In other words, the embodiment of FIG. 9 illustrates that first inductivity 105 and second inductivity 106 need not necessarily be implemented as a common mode choke. In some embodiments, in order to reduce influences inductivities 105, 106 may have on the switching behavior of the switch device of FIG. 9 in normal operation, small inductivity values may be used for first inductivity 105 and second inductivity 106. For example, the inductivity values of first inductivity 105 and second inductivity 106 in the embodiment of FIG. 9 may be of the order of some 10 nH. Inductivities having such small inductivity values in some embodiments may influence normal behavior of the switch device only in a negligible manner and nevertheless be able to detect a beginning avalanche breakdown, as avalanche breakdown may be characterized by a rapid increase of current, inducing a measurable voltage. On the other hand, normal switching operation may be considerably slower than an avalanche breakdown in some embodiments, thus inducing only negligible voltages over inductivities 105, 106 in the embodiment of FIG. 9 in some implementations.

First inductivity 105 and second inductivity 106 in the embodiment of FIG. 9 (and also in other embodiments like the embodiment of FIG. 10 described later on) may also be implemented as Rogowski-coils (as illustrated e.g. in FIG. 6C), which in some embodiments may attenuate noise from current spikes caused by voltage transients on the high voltage supply rails or the gate lines which noise affects both power devices 101, 102 in FIG. 9 (or e.g. also 201, 202 in FIG. 10 described later) in the same way. Such noise from current spikes may be harder to attenuate (if relevant) in a circuit 60 as illustrated in FIGS. 6B and 6C when a single Rogowski coil (68) is wound around current path 62. However, for some applications a single Rogowski coil as illustrated in FIGS. 6B and 6C may be sufficient.

Apart from the absence of the magnetic coupling 112 and/or implementation as a common mode choke of first and second inductivities 105 and 106, the embodiment of FIG. 9 may correspond to the embodiment of FIG. 8 and will not be described again in detail.

In the embodiments of FIGS. 8 and 9, first load terminal 110 may be a high side terminal, i.e. a terminal coupled on a "side" of a positive supply voltage, and second load terminal 111 may be a low side terminal, for example a terminal on a "side" of a negative supply voltage or ground.

The switch devices of FIGS. 8 and 9 may be used for example as a high side switch device or as a low side switch device. In the embodiments of FIGS. 8 and 9, first and second inductivities 105, 106 are then arranged on a "low side" of switches 101, 102, respectively, i.e. between switch devices 101, 102 and terminal 111. In other embodiments, inductivities may be arranged on a high side of switches. A corresponding embodiment is illustrated in FIG. 10.

Figure 10:
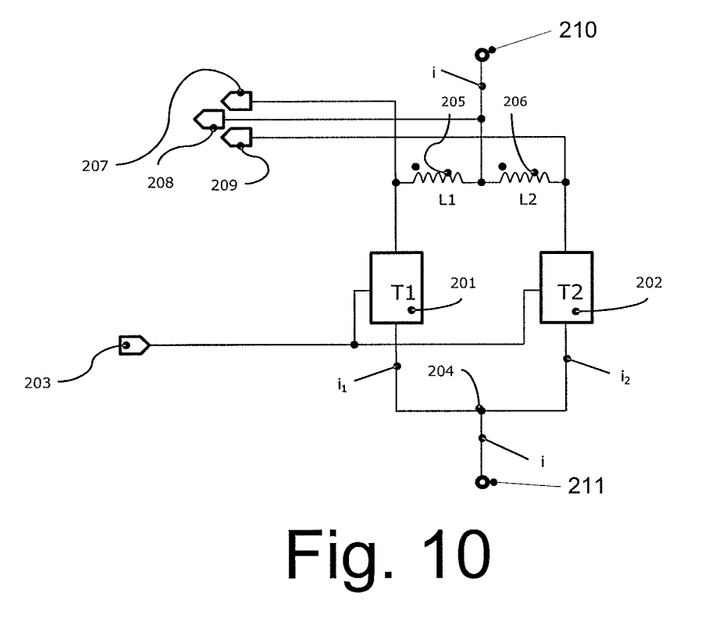
FIG. 10 is a circuit diagram illustrating a device according to an embodiment.

In the embodiment of FIG. 10, elements or components 201-211 essentially correspond to components 101-111 of the embodiments of FIGS. 8 and 9 and will not be described again in detail.

In contrast to the embodiments of FIGS. 8 and 9, in the embodiment of FIG. 10 a first inductivity 205 and a second inductivity 206 are arranged between a first load terminal 210 of the switch device and switches 201, 202, respectively, as shown. In other words, in the embodiment of FIG. 10 first inductivity 205 and second inductivity 206 may be arranged on a high side of first switch 201 and second switch 202. Variations and modifications discussed with reference to FIGS. 8 and 9 may also apply to the embodiment illustrated in FIG. 10. For example, first inductivity 205 and second inductivity 206 may be implemented with a magnetic coupling and/or as a common mode choke, or may be implemented without magnetic coupling, for example using comparatively low inductivity values. Other implementations are also possible.

Generally, variations and modifications described for one of the embodiments may also be applicable to other embodiments, unless specifically noted otherwise.

Figure 11:
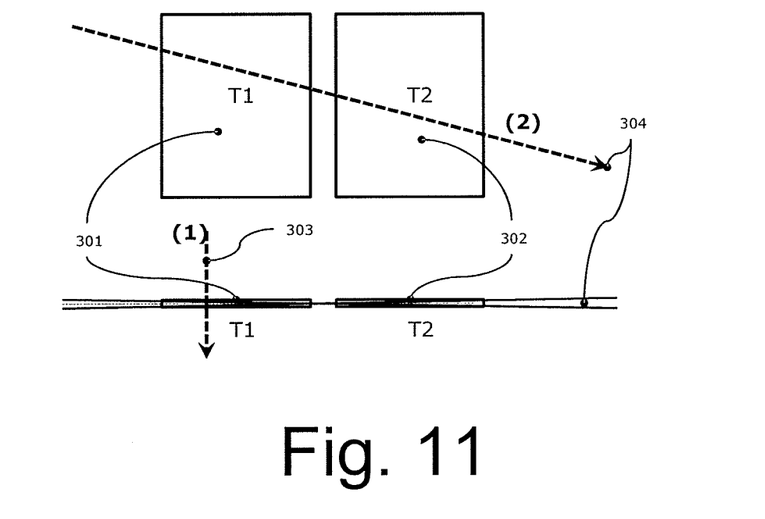
FIG. 11 is a diagram illustrating a possible spatial arrangement of switch devices usable in some embodiments.

In FIG. 11, a spatial arrangement of a first switch 301 and a second switch 302 according to some embodiments is shown. It should be noted that apart from the illustration of FIG. 11, arrangements of elements in the Figures are not to be construed as indicating a specific spatial arrangement, but is chosen merely for ease of representation. The spatial arrangement illustrated in FIG. 11 may for example be applied to switches 101, 102 of the embodiment of FIGS. 8 and 9, switches 201, 202 of the embodiment of FIG. 10 or switches of the embodiments of FIGS. 12-15 as explained further below. An upper part of FIG. 11 illustrates a plane view, and a lower part illustrates a cross-sectional view. In the embodiment of FIG. 11, first switch 301 and second switch 302 are arranged in a plane.

Such an arrangement of switches may be part of the design of a single chip in case first switch 301 and second switch 302 are provided on a single chip. In case first switch 301 and second switch 302 are provided on different chips, the switches may be arranged in a plane as illustrated in FIG. 11 for example on a printed circuit board or other carrier for first switch 301 and second switch 302.

In such an arrangement, a probability that particle, for example stemming from cosmic radiation, affects both first switch 301 and second switch 302 is comparatively low. Only radiation within a comparatively small solid angle, as indicated by arrows 304 in particular in the cross-sectional view, may affect both first switch 301 and second switch 302. Other particles, as illustratively shown by an arrow 303, affect only one of the switches, for example first switch 301 in case of a particle according to arrow 303. In particular, usually the "height" or depth shown in the cross-sectional view of semiconductor-based switches are comparatively low, thus reducing the solid angle in which for example a particle may affect both first switch 301 and second switch 302 and therefore cause for example an avalanche effect in both switches 301, 302.

In other words, in some embodiments with an arrangement in FIG. 11 a great majority of particles or other radiation effects may affect only one of the switches 301, 302 at the same time, which may be detected via inductivities, as will be explained below in further detail.

Figure 12:
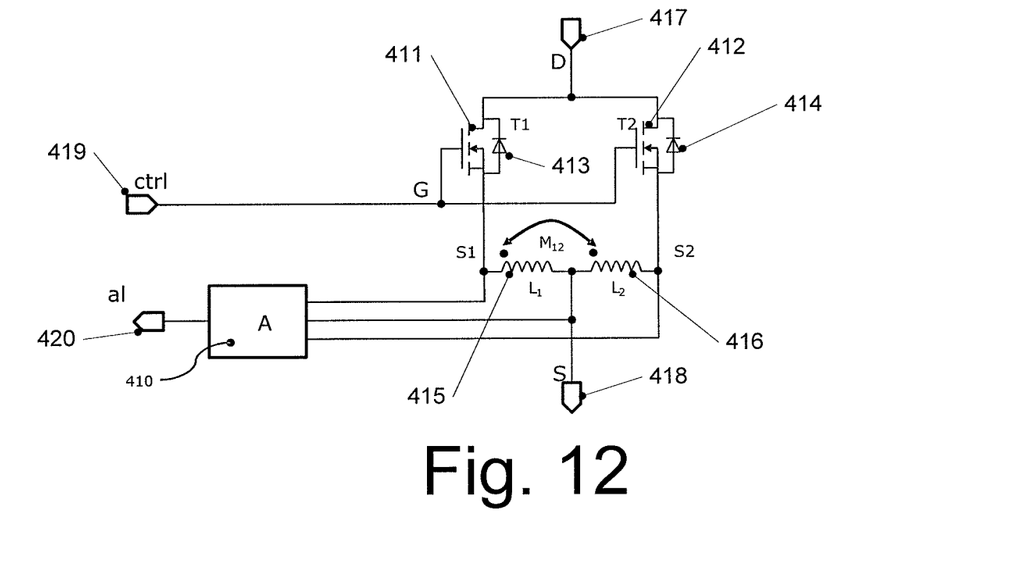
FIG. 12 is a circuit diagram illustrating a device according to an embodiment.

In FIG. 12, a switch device according to a further embodiment is illustrated. The embodiment of FIG. 12 comprises a first switch and a second switch. The first switch comprises a transistor 411, for example a field effect transistor, or an insulated gate bipolar transistor, but not limited thereto. In FIG. 12, as an illustrative example a field effect transistor is shown. A recovery diode 413 is coupled between drain and source terminals of transistor 411.

A second switch comprises a second transistor 412, which may be implemented corresponding to first transistor 411. A second recovery diode 414 is coupled between drain and source terminals of second transistor 412.

Drain terminals of first transistor 411 and second transistor 412 are coupled with a drain terminal 417 of the switch device of FIG. 12. Drain terminal 417 may correspond to a first load terminal of the switch device.

A first terminal of a first inductivity 415 is coupled with a source terminal of first transistor 411. A first terminal of a second inductivity 416 is coupled with a source terminal of second transistor 412. A second terminal of first inductivity 415 and a second terminal of second inductivity 416 are coupled with a source terminal 418, which may serve as a second load terminal of the switch device of FIG. 12.

A control terminal 419 is coupled with gate terminals of first transistor 411 and second transistor 412 and may serve as a control terminal of the switch device of FIG. 12.

Variations regarding first switch 101, 102 of FIGS. 8 and 9 are first switch 201 and second switch 202 of the embodiment of FIG. 10 and may also be applicable to the first and second switches of the device of FIG. 12. Moreover, variations discussed with reference to the first and second inductivities of the embodiments of FIGS. 8-10 may also be applicable to first and second inductivities 415, 416 of the embodiment of FIG. 12. For example, while in FIG. 12 a magnetic coupling between first inductivity 415 and second inductivity 416 is shown, and/or first inductivity 415 and second inductivity 416 may be implemented as a common mode choke, in other embodiments the magnetic coupling may be omitted, similar to the embodiment of FIG. 9. Furthermore, while in the embodiment of FIG. 12 first inductivity 415 and second inductivity 416 are shown on a source side of first transistor 411 and second transistor 412, in other embodiments the inductivities may be arranged on a drain side, similar to the embodiment of FIG. 10.

A voltage at the first terminal of first inductivity 415 (node S1), a voltage at the first terminal of second inductivity 416 (node S2) and a voltage at the second terminals of first inductivity 415 and second inductivity 416 are fed to an evaluation circuit 410. Evaluation circuit 410 may be implemented in hardware, software, firmware or combinations thereof and may for example comprise components like analog-to-digital converters for obtaining digital representations of the voltages and logic elements for evaluating the digital representations. In some implementations, evaluation circuit 410 may comprise a processor executing programs to evaluate the digital representations. Evaluation of the voltages will be explained in more detail below.

Evaluation circuit 410 in case of an error detection may output an alert signal al at an output terminal 420 in the embodiment of FIG. 12.

Next, operation of the embodiment of FIG. 12 will be explained with reference to FIGS. 13 and 14.

Figure 13:
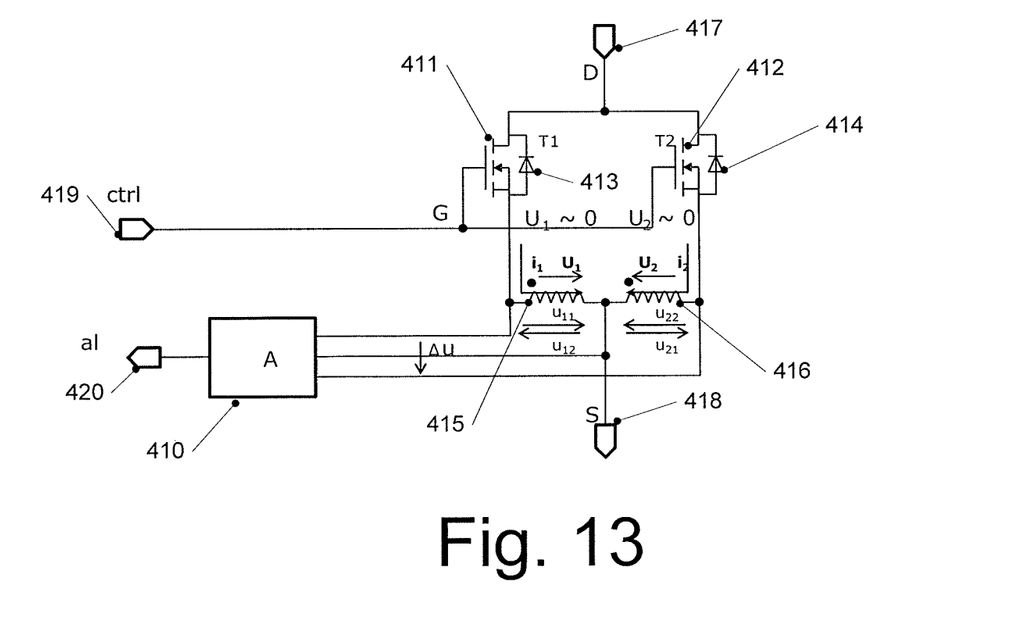
FIGS. 13 and 14 are circuit diagrams illustrating a behavior of the device of FIG. 12 under various circumstances.

In FIG. 13, currents and voltages in normal operation of the embodiment of FIG. 12 are illustrated. In normal operations, both transistors 411, 412 are switched simultaneously by control signal ctrl at control terminal 419. A current i1 via first transistor 411 and a current i2 via second transistor 412 therefore have an approximately simultaneous onset and decay, and i1~i2 holds. These currents cause induced voltages in first inductivity 415 and second inductivity 416 as follows:

$$u11 = d/dt(i1)*L1$$

$$u12 = d/dt(i2)*M12$$

$$u22 = d/dt(i2)*L2$$

$$u21 = d/dt(i1)*M12$$

$u_{11}$ designates a voltage induced in first inductivity 415 by current $i_1$, $u_{22}$ designates a voltage induced in second inductivity 416 by current $i_2$, $u_{12}$ designates a voltage induced in first inductivity 415 by second inductivity 416, and $u_{21}$ designates a voltage induced by first inductivity 415 in second inductivity 416. $M_{12}$ as noted previously designates the mutual inductance. For a common mode choke implementation with $L_1 = M_{12} = L_2$ as explained, $u_{11} = -u_{12} = -u_{22} = u_{21}$ may apply. Therefore, in this case a voltage $U_1$ across first inductivity 415 is at least approximately 0, and a voltage $U_2$ across second inductivity 416 also is approximately 0.

In this case, a voltage difference $\Delta u$ between $U_1$ and $U_2$ ($U_1 - U_2$) which may be sensed by evaluation circuit 410 may also be approximately 0.

Figure 14:
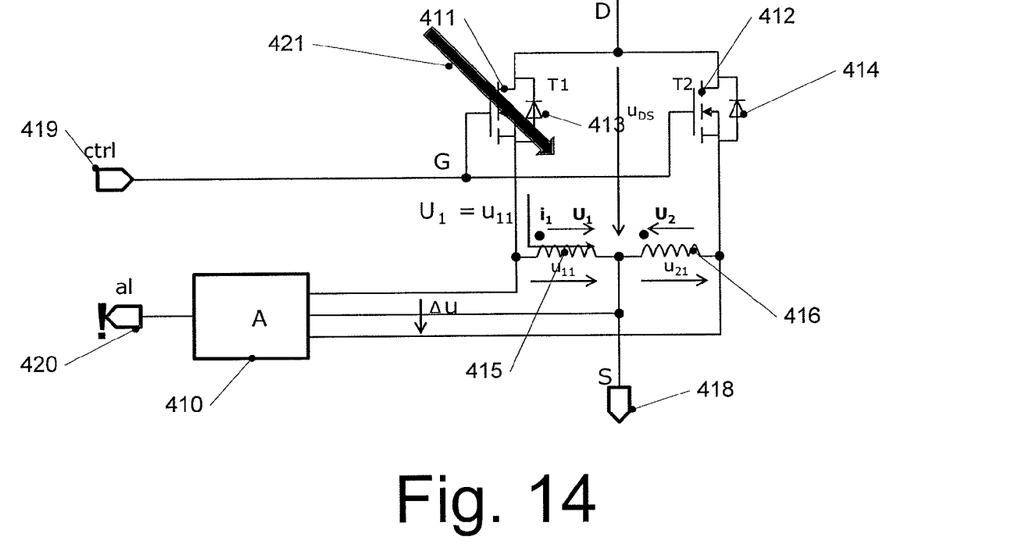

FIG. 14 illustrates a case where, in the embodiment of FIG. 14, first transistor 411 and second transistor 412 are both in an open state, i.e. off. In this state, a particle as indicated by an arrow 421, for example a particle of cosmic radiation, interacts with first transistor 411, initiating an avalanche effect with filament formation as explained above.

This in an example causes a current $i_t$ to flow via first transistor 411, while second transistor 412 is still open (corresponding to $i_2 \sim 0$.

Voltages $u_{11}$ and $u_{21}$ as above may then be written as follows:

$$u_{11} = d/dt(i_1) \cdot L_1$$

$$u_{21} = d/dt(i_1) \cdot M_{12}$$

As in the embodiment discussed $L_1 \sim M_{12}$, $u_{11} \sim u_{21}$ applies. $u_2$, assuming that the arrows below $U_1$ and $U_2$ in FIG. 14 denote the positive direction, then $U_1 = u_{11}$ and $U_2 = -u_{21}$. A voltage difference $\Delta u$ measured by evaluation circuit 410 is then $$\Delta u = U_1 - U_2 = 2 * d/dt(i_1) * L_1$$

Therefore, in contrast to the case of FIG. 13 where $\Delta u$ was approximately 0, now $\Delta u$ has a non-zero value. If such a non-zero value, for example a value exceeding a threshold, is detected by evaluation circuit 410, in some embodiments evaluation circuit 410 may output a corresponding alert signal al.

To give some numerical examples for power MOSFETs as first transistor 411 and second transistor 412, a drain-source voltage in an open state of the transistors may be of the order of 600 V. A particle may then cause a current $i_1$ of the order of 1-3 A to flow. An onset time of such a current may be of the order of 1 nanosecond or less. In other words, a slope MOO may be greater than $10^9$ As$^{-1}$. Even for small inductivities $L_1$, $L_2$ of approximately 10 nH, this would induce a voltage drop of the order of 10 V, which is easily detectable. As this induction occurs very fast, a very fast detection of such a failure event, for example within about 10 nanoseconds, may be possible in some embodiments.

On the other hand, for high voltage applications switching voltages of some 100 V, even in normal operation such voltage drops of 10 V may have negligible influence on the operation of the switch device in normal operation.

In embodiments where first inductivity 415 and second inductivity 416 are implemented as a common mode choke, also greater inductivity values may be used, as the effects of the inductivities may cancel each other out during normal operation. For example, inductivities with inductivity values of 100 nH or more may be used in some embodiments without significant impact on normal operation of the switch device. In some embodiments, inductivities having greater inductivity values may slow down a current increase in a filament formed in a transistor like transistor 411 due to a particle, which may give more time for evaluation and/or countermeasures. In some embodiments, a greater inductivity may also reduce a heating of the filament and may in some cases even prevent an irreversible damage to the transistor.

For example, when at an operating voltage of 600 V an inductivity values $L_1$, $L_2$ each are about 1 μH, a current in a filament may take longer than 1.5 ns to reach a value of about 1 A. Without inductivities, a time duration may be only 1/10 of this value or less. In some circumstances, this may even be sufficient as a measure against destruction in implementations where the inductivities may cope with the full operating voltage without generating overvoltage in a gate-source area of the transistors or in an evaluation circuit. In such embodiments, the inductivities may be provided on a high side of switches like transistors, as illustratively shown in FIG. 10.

It should be noted that the above numerical values serve only for further illustration and may vary depending on the implementation and embodiment.

Figure 15:
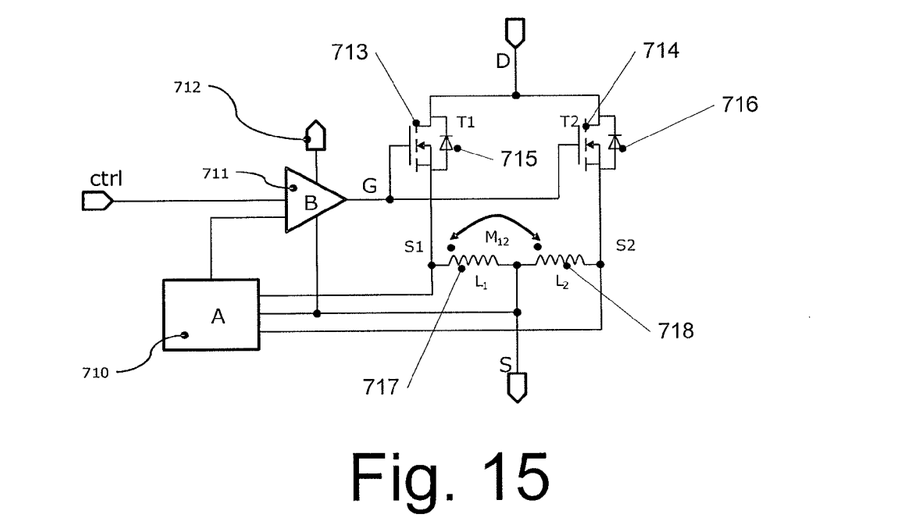
FIG. 15 is a circuit diagram illustrating a device according to an embodiment.

In some embodiments, in response to the alert signal of FIG. 14, a warning message may be output. In other embodiments, the switch device may be temporarily closed, as explained already with reference to FIGS. 1-7. In other words, the detection mechanism discussed with reference to FIGS. 8-14 may be combined with the techniques disclosed with reference to FIGS. 1-7, but may also be used independently therefrom. FIG. 15 illustrates an embodiment combining the techniques disclosed with reference to FIGS. 1-7 with the embodiment of FIG. 12. FIG. 15 illustrates a switch device comprising a first switch and a second switch. The first switch comprises a transistor 713 and a recovery diode 715, and the second switch comprises a second transistor 714 and a second recovery diode 716. Furthermore, the switch device of FIG. 15 comprises a first inductivity 717 and a second inductivity 718. Elements 713-718 may be implemented and arranged corresponding to elements 411-416 discussed with reference to FIGS. 12-14, and variations and alterations discussed with reference to FIGS. 12-14 may also apply to the embodiment of FIG. 15.

Furthermore, the embodiment of FIG. 15 comprises an evaluation circuit 710, which may essentially correspond to evaluation circuit 410 of the embodiments of FIGS. 12-14. In the embodiment of FIG. 15, evaluation circuit 710 may output an alert signal indicating a detected avalanche breakdown to a driver 711. In normal operation, driver 711 may control gate terminals of transistors 713, 714 based on a control signal ctrl. In case of an alert signal indicating an avalanche breakdown, driver circuit 711 may temporarily close transistors 713, 714 to reduce an electric field and therefore stop or reduce the avalanche effect. For this, driver 711 may use charge from an auxiliary supply 712, for example from a capacitor like capacitor 67 illustrated in FIG. 6. Such a capacitor may be located physically close to the gate terminals of the switches like transistors 713, 714 to be switched to enable a rapid response to an avalanche breakdown or other failure event being detected.

After some predetermined waiting time and/or after Δu has fallen below a predetermined threshold, transistors 713, 714 may be opened again. In some embodiments, the predetermined waiting time may also be determined by a size of a capacitor serving as auxiliary supply, for example by an amount of charge the capacitor may store. In other embodiments, other techniques may be used.

Figure 16:
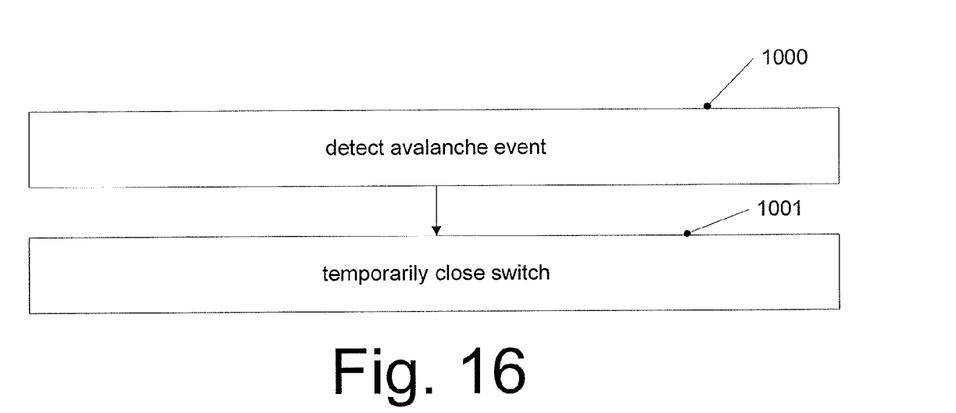
FIG. 16 is a flowchart illustrating a method according to an embodiment.
Figure 17:
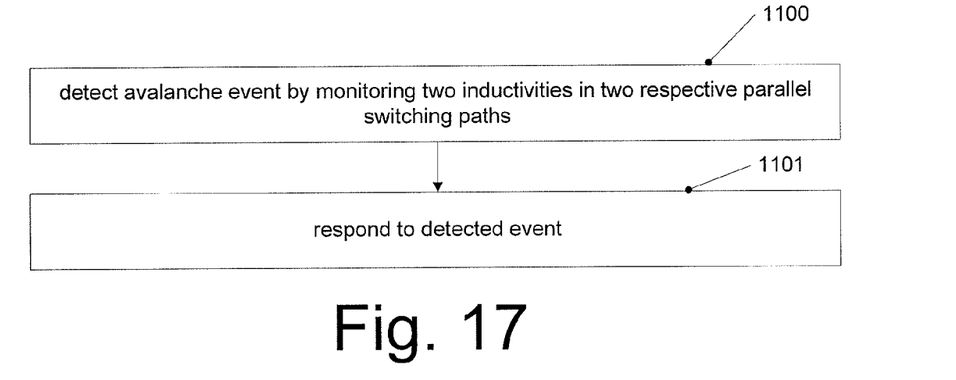
FIG. 17 is a flowchart illustrating a method according to a further embodiment.

In FIGS. 16 and 17, methods according to some embodiments are schematically illustrated. The methods illustrated with respect to FIGS. 16 and 17 may be implemented using the devices illustrated with respect to FIGS. 1-15, but also be implemented independently therefrom. While the methods are illustrated as a series of acts or events, the order in which such acts or events are illustrated is not to be construed as limiting. Furthermore, the methods illustrated in FIGS. 16 and 17 may be used separately from each other, but may also be combined.

At 1000 in FIG. 16, the method comprises detecting an avalanche event or other failure event in a switch device, for example in an open switch device. At 1001, in response to detecting the event the method comprises temporarily closing the switch device, e.g. to reduce an electric field which may reduce or stop an avalanche effect in some implementation. After a certain time, the switch may be opened again.

In FIG. 17, at 1100 the method comprises detecting an avalanche event by monitoring two inductivities in two respective parallel switching paths. For example, voltages across the inductivities may be monitored in some embodiments. At 1101, the method of FIG. 17 comprises responding to the detected event. For example, a response may comprise shutting down a device, issuing a warning message and/or temporarily closing a switch as in 1001 of FIG. 16. Other techniques may also be employed.

The above-described embodiments serve only as examples and are not to be construed as limiting. In particular, in other embodiments other features or elements than the ones explicitly described above may be used. Techniques disclosed herein may be used in various applications like automotive applications or aerospace applications, but are not limited in this respect.

What is claimed is:

1. A device comprising:
   a first switch configured to be coupled to a load; and
   a control circuit configured to temporarily close the first switch in response to a detection of a failure event in the first switch.

2. The device of claim 1, wherein the control circuit comprises a driver coupled to a control terminal of the first switch.

3. The device of claim 1, wherein the control circuit comprises a supply element configured to supply charge to temporarily close the first switch.

4. The device of claim 3, wherein the supply element comprises a capacitor.

5. The device of claim 1, further comprising a detection circuit configured to detect the failure event.

6. The device of claim 1, wherein the detection circuit is configured to monitor a current increase through the first switch.

7. The device of claim 5, further comprising a second switch coupled in parallel with the first switch, wherein the detection circuit comprises a first inductivity coupled in series with the first switch and a second inductivity coupled in series with the second switch.

8. The device of claim 7, wherein the detection circuit further comprises an evaluation circuit configured to evaluate a voltage drop over at least one of the first inductivity or the second inductivity.

9. The device of claim 1, wherein the first switch comprises a transistor.

10. The device of claim 7, wherein the device comprises a full bridge circuit, and wherein each switch is arranged in a bridge branch of the full bridge circuit.

11. A switch device comprising:
a first switch;
a second switch, wherein a control terminal of the first switch is coupled with a control terminal of the second switch, and wherein a first load terminal of the first switch is coupled with a first load terminal of the second switch;
a first inductivity, wherein a first terminal of the first inductivity is coupled with a second load terminal of the first switch;
a second inductivity, wherein a first terminal of the second inductivity is coupled with a second load terminal of the second switch, wherein a second terminal of the first inductivity is coupled with a second terminal of the second inductivity; and
an evaluation circuit configured to detect an avalanche event based on at least one of a voltage drop between the first terminal of the first inductivity and the second terminal of the first inductivity and a voltage drop between the first terminal of the second inductivity and the second terminal of the second inductivity.

12. The device of claim 11, wherein the first inductivity and the second inductivity are magnetically coupled with each other.

13. The device of claim 11, wherein the first inductivity and the second inductivity are implemented as a common mode choke.

14. The device of claim 11, wherein the first inductivity and the second inductivity are arranged on a low voltage side of the first switch and the second switch, respectively.

15. The device of claim 11, wherein the first inductivity and the second inductivity are arranged on a high voltage side of the first switch and the second switch, respectively.

16. The device of claim 11, wherein the first switch and the second switch are essentially arranged in a plane.

17. A method, comprising:
detecting an avalanche event; and
temporarily closing a switch in response to detecting the avalanche event.

18. The method of claim 17, wherein detecting the avalanche event comprises monitoring a current increase through the switch.

19. The method of claim 17, wherein detecting the avalanche event comprises monitoring a voltage difference between a voltage across a first inductivity coupled to the switch and a second inductivity coupled to a further switch parallel to the switch.

* * * * *